(12) United States Patent
Huang et al.

(10) Patent No.: US 11,894,430 B2
(45) Date of Patent: Feb. 6, 2024

(54) SEMICONDUCTOR STRUCTURE

(71) Applicant: Vanguard International Semiconductor Corporation, Hsinchu (TW)

(72) Inventors: Shao-Chang Huang, Hsinchu (TW); Kai-Chieh Hsu, Taoyuan (TW); Chun-Chih Chen, New Taipei (TW); Chih-Hsuan Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 190 days.

(21) Appl. No.: 17/476,828

(22) Filed: Sep. 16, 2021

(65) Prior Publication Data
US 2023/0078296 A1    Mar. 16, 2023

(51) Int. Cl.
*H01L 29/40* (2006.01)
*H01L 29/06* (2006.01)
*H01L 29/10* (2006.01)

(52) U.S. Cl.
CPC ........ *H01L 29/404* (2013.01); *H01L 29/0607* (2013.01); *H01L 29/1095* (2013.01)

(58) Field of Classification Search
CPC .............. H01L 29/404; H01L 29/0607; H01L 29/1095
USPC ....................................................... 257/343
See application file for complete search history.

(56) References Cited

U.S. PATENT DOCUMENTS

| | | | |
|---|---|---|---|
| 7,675,120 B2 | 3/2010 | Sekiguchi et al. | |
| 7,964,915 B2 | 6/2011 | Tanaka et al. | |
| 2005/0253168 A1* | 11/2005 | Wu | H01L 29/812 257/E29.253 |
| 2007/0108533 A1* | 5/2007 | Sekiguchi | H01L 27/0629 257/E27.035 |
| 2007/0200195 A1* | 8/2007 | Tanaka | H01L 29/0878 257/E29.268 |
| 2012/0217581 A1* | 8/2012 | Kondou | H01L 29/404 257/E29.256 |
| 2021/0104630 A1* | 4/2021 | Chung | H01L 29/66659 |

OTHER PUBLICATIONS

Taiwanese Office Action and Search Report for Taiwanese Application No. 110116163, dated Apr. 27, 2023.

* cited by examiner

*Primary Examiner* — Mohammad M Hoque
(74) *Attorney, Agent, or Firm* — Birch, Stewart, Kolasch & Birch, LLP

(57) ABSTRACT

A semiconductor structure, including a substrate, a first well, a second well, a first doped region, a second doped region, a first gate structure, a first insulating layer, and a first field plate structure. The first and second wells are disposed in the substrate. The first doped region is disposed in the first well. The second doped region is disposed in the second well. The first gate structure is disposed between the first and second doped regions. The first insulating layer covers a portion of the first well and a portion of the first gate structure. The first field plate structure is disposed on the first insulating layer, and it partially overlaps the first gate structure. Wherein the first field plate structure is segmented into a first partial field plate and a second partial field plate separated from each other along a first direction.

16 Claims, 7 Drawing Sheets

SEMICONDUCTOR STRUCTURE

BACKGROUND OF THE INVENTION

Field of the Invention

The present disclosure relates to a semiconductor structure, and, in particular, to a semiconductor structure with a field plate.

Description of the Related Art

High-voltage semiconductor devices use gate voltages to generate channels and control the current flowing between the source and drain. In a conventional high-voltage semiconductor structure, the length of the channel is increased to avoid a punch-through effect between the source and the drain. However, the size of the device is increased, meaning that the chip area is also increased, causing the resistance in the turn-on resistor of the transistor to be higher.

BRIEF SUMMARY OF THE INVENTION

In accordance with an embodiment of the present disclosure, a semiconductor structure comprises a substrate, a first well, a second well, a first doped region, a second doped region, a first gate structure, a first insulating layer, and a first field plate structure. The first well is disposed in the substrate and has a first conductivity type. The second well is disposed in the substrate, adjacent to the first well, and has a second conductivity type that is opposite to the first conductivity type. The first doped region is disposed in the first well. The second doped region is disposed in the second well. The first gate structure is disposed between the first doped region and the second doped region. The first insulating layer overlaps a portion of the first well and a portion of the first gate structure. The first field plate structure is disposed on the first insulating layer and at least partially overlapping the first gate structure. The first field plate structure is segmented into a first partial field plate and a second partial plate along a first direction. Wherein the first partial field plate and the second partial field plate are separated from each other.

In accordance with another embodiment of the present disclosure, a semiconductor structure comprises a substrate, a first well, a second well, a third well, a first doped region, a second doped region, a first gate structure, a first insulating layer, and a first field plate structure. The first well is disposed in the substrate and has a first conductivity type. The second well is disposed in the substrate, surrounding the first well, and has a second conductivity type that is opposite to the first conductivity type. The third well is disposed in the substrate, surrounds the second well, and has the first conductivity type. The first doped region is disposed in the first well. The second doped region is disposed in the second well and adjacent to a first side of the first well. The first gate structure is disposed between the first doped region and the second doped region. The first insulating layer overlaps a portion of the first well region and a portion of the first gate structure. The first field plate structure is disposed on the first insulating layer and partially overlapping the first gate structure. The first field plate structure is segmented into a first plurality of partial field plates along a first direction.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

In order to achieve the above-mentioned purposes and effects, the technical means and structure adopted by the present disclosure are illustrated in a schematic manner and in conjunction with the preferred embodiments of the present disclosure, and its features and functions are described in detail as follows, for the benefit of a complete understanding.

Figure 1:
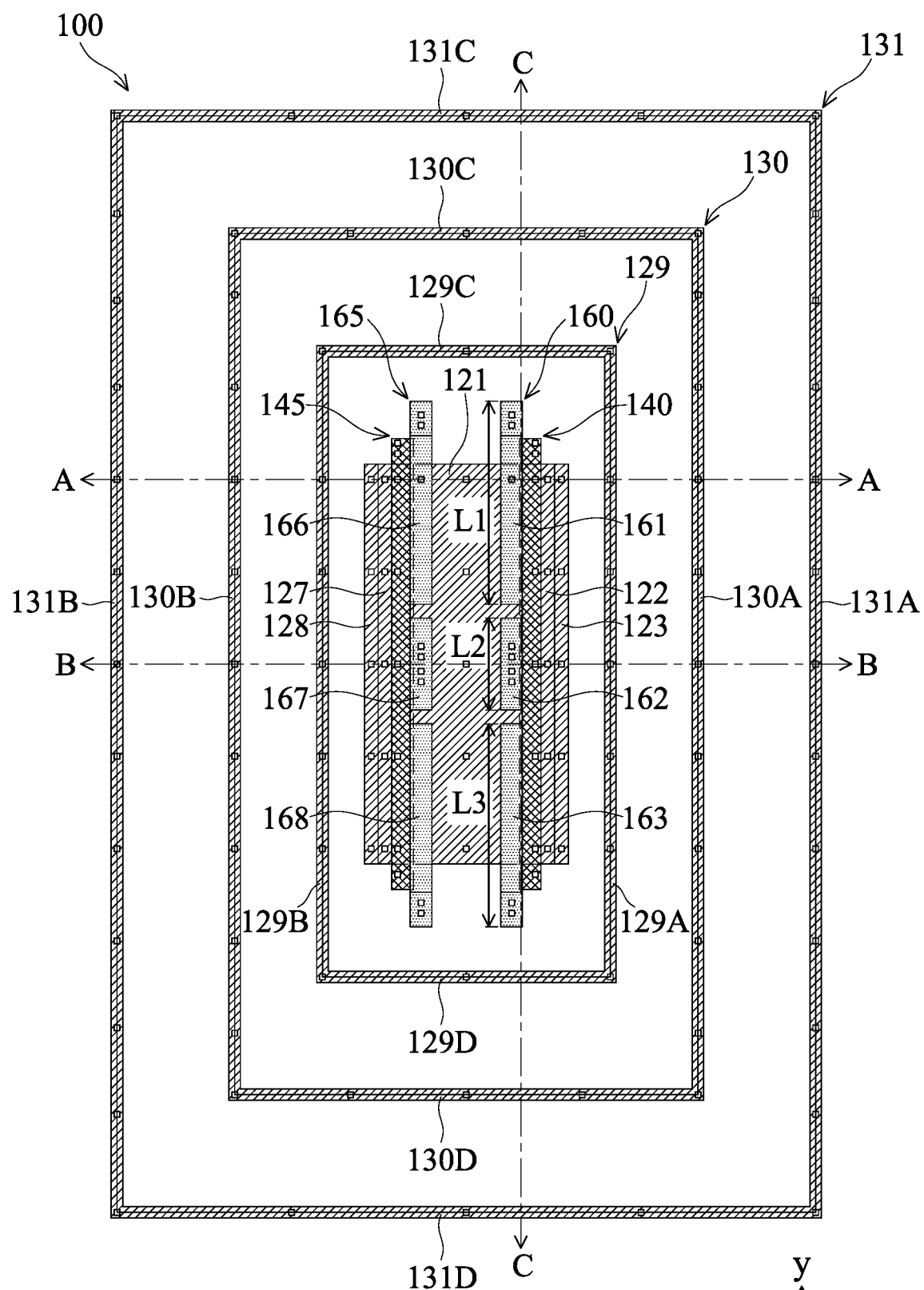
FIG. 1 is a top view of an exemplary embodiment of a semiconductor structure, according to various aspects of the present disclosure.
Figure 2A:
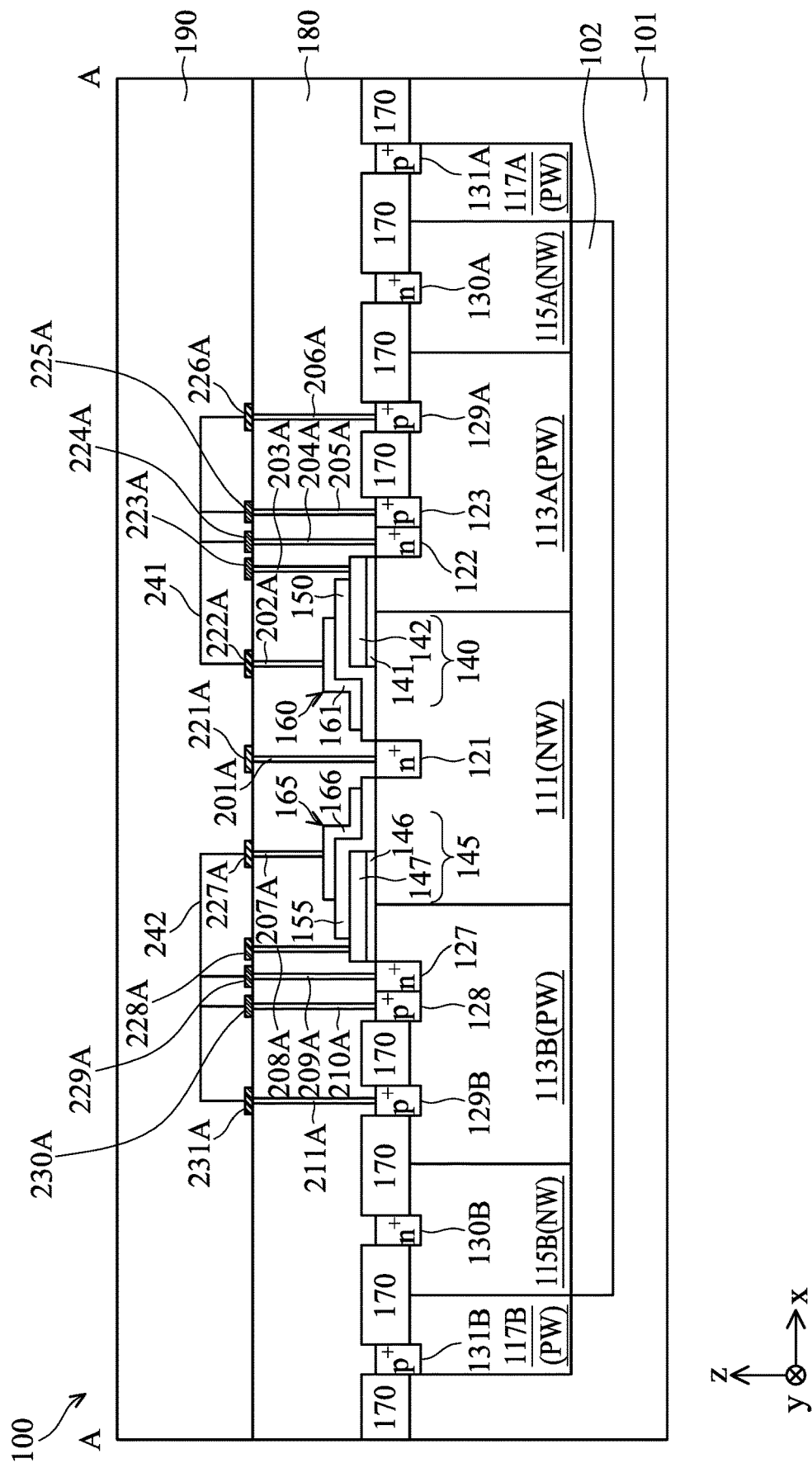
FIG. 2A is a cross-sectional view of the semiconductor structure along a line A-A in FIG. 1, according to various aspects of the present disclosure.
Figure 2B:
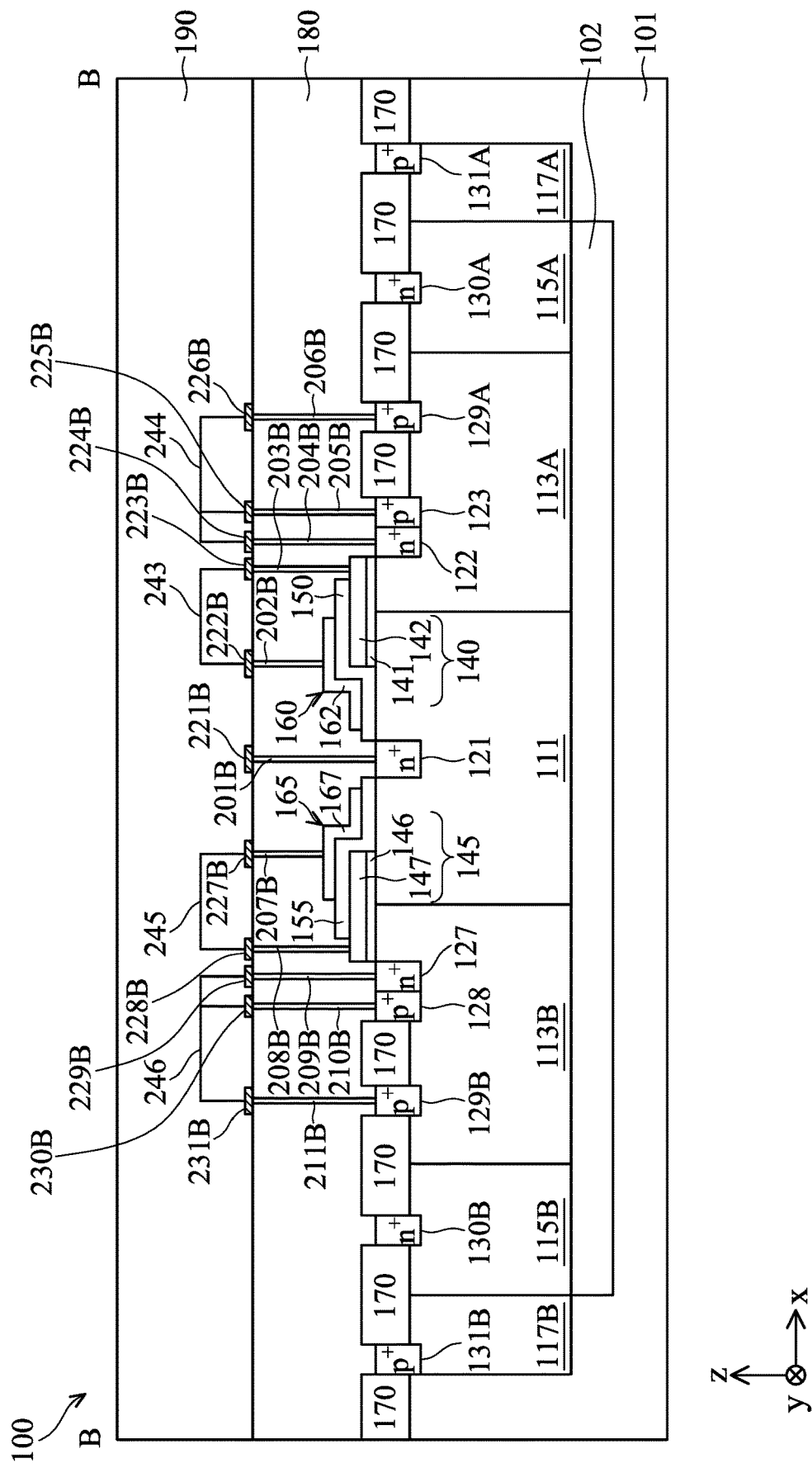
FIG. 2B is a cross-sectional view of the semiconductor structure along a line B-B in FIG. 1, according to various aspects of the present disclosure.
Figure 2C:
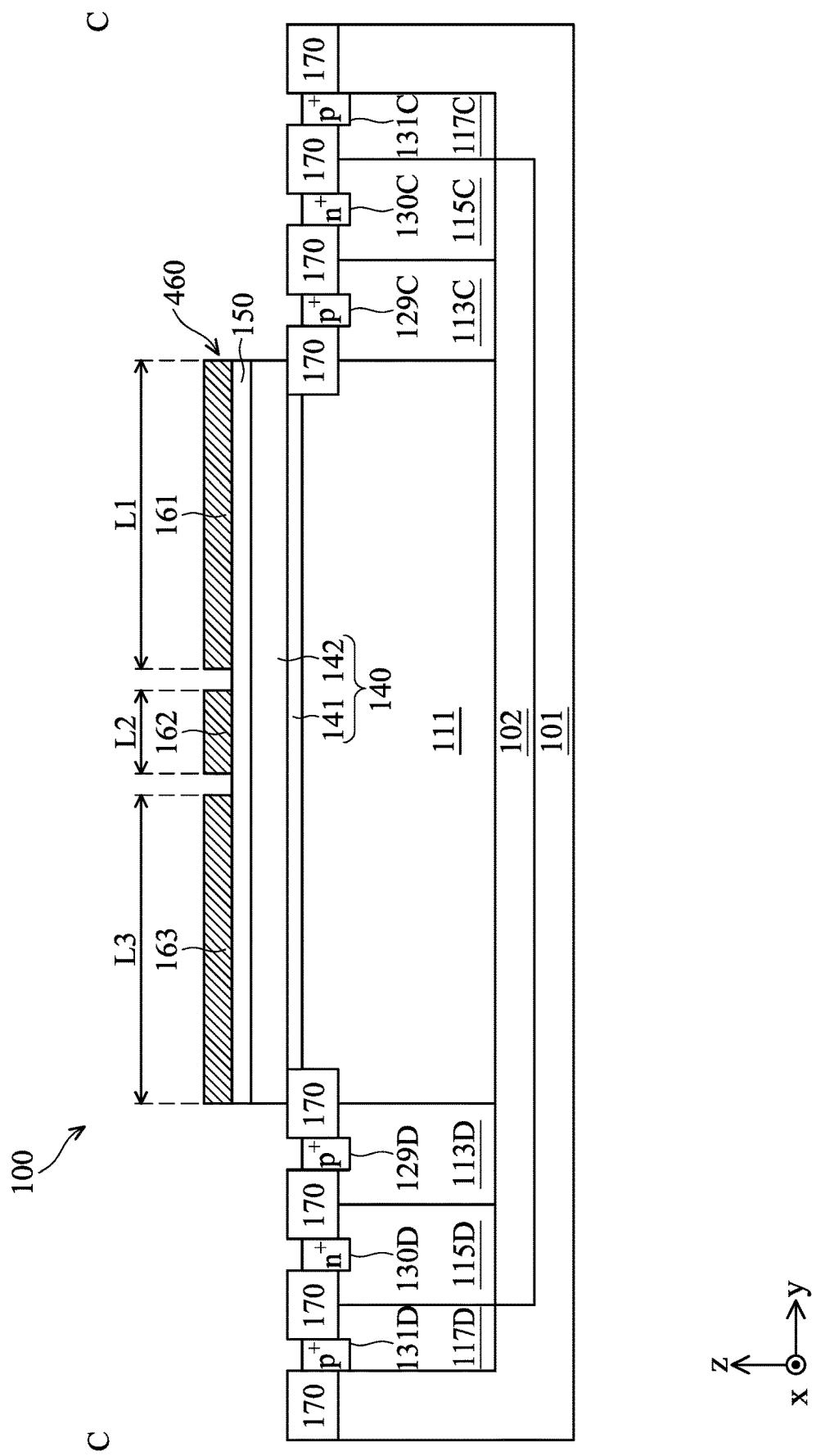
FIG. 2C is a cross-sectional view of the semiconductor structure along a line C-C in FIG. 1, according to various aspects of the present disclosure.

FIG. 1 is a top view of a semiconductor structure of the present disclosure. FIG. 2A is a cross-sectional view of the semiconductor structure of the present disclosure along the line A-A in FIG. 1. FIG. 2B is a cross-sectional view of the semiconductor structure of the present disclosure along the line B-B in FIG. 1. FIG. 2C is a cross-sectional view of the semiconductor structure of the present disclosure along the line C-C in FIG. 1. It should be noted that, for the purpose of simplicity and clarity, some features and/or reference signs are omitted in FIG. 1 and FIG. 2C. Referring to FIG. 1 and FIGS. 2A to 2C, in some embodiments, a semiconductor structure 100 comprises a substrate 101, a well 111, a well 113A, a doped region 121, a doped region 122, a doped region 123, a doped region 129A, a gate structure 140, an insulating layer 150, and a field plate structure 160. In other embodiments, the semiconductor structure further comprises wells 113B, 113C, 113D, 115A, 115B, 115C, 115D, 117A, 117B, 117C, and 117D; doped regions 130A, 131A, 127, 128, 129B, 130B, 131B, 129C, 130C, 131C, 129D, 130D, and 131D; a gate structure 145; an insulating layer 155; and a field plate structure 165.

The substrate 101 may be a semiconductor substrate, such as a silicon substrate. In addition, the material of the semiconductor substrate may also be another elementary semiconductor, such as germanium (Ge); a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Furthermore, the substrate 101 may also be a semiconductor-on-insulator substrate. In some embodiments, the substrate 101 may be an undoped substrate. Alternatively, in other embodiments, the substrate 101 may also be a lightly-doped substrate, such as a lightly-doped p-type substrate or a lightly-doped n-type substrate.

The wells 111 and 113A are formed in the substrate 101. In some embodiments, the wells 113B~113D, 115A~115D, and 117A~117D are also formed in the substrate 101. In some embodiments, all of the wells 111, 113A~113D, 115A~115D, and 117A~117D are high-voltage wells, wherein the wells 111 and 115A~115D have a first conductivity type, and the wells 113A~13D and 117A~17D have a second conductivity type that is opposite to the first conductivity type. For example, when the first conductivity type is n-type and the second conductivity type is p-type, the n-type wells can be formed by implanting phosphorus ions or arsenic ions, and the p-type wells can be formed by implanting boron ions or indium ions. Similarly, when the first conductivity type is p-type and the second conductivity type is n-type, the n-type wells can be formed by implanting phosphorus ions or arsenic ions, and the p-type wells can be formed by implanting boron ions or indium ions.

In some embodiments, the wells 113A, 113B, 113C, and 113D collectively constitute a first ring structure. The first ring structure surrounds the well 111 in X-Y plane. In other embodiments, the wells 113A~113D do not constitute a ring structure. In these embodiments, the wells 113A~113D may be electrically isolated from each other. In certain embodiments, the semiconductor structure 100 includes only one, two, or three of the wells 113A~113D. In some embodiments, the wells 115A, 115B, 115C, and 115D collectively constitute a second ring structure. The second ring structure surrounds the first ring structure in X-Y plane. In other embodiments, the wells 115A~115D do not constitute a ring structure. In these embodiments, the wells 115A~115D may be electrically isolated from each other. In certain embodiments, the semiconductor structure 100 includes only one, two, or three of the wells 115A~115D. In some embodiments, the wells 117A, 117B, 117C, and 117D collectively constitute a third ring structure. The third ring structure surrounds the second ring structure in X-Y plane. In other embodiments, the wells 117A~117D do not constitute a ring structure. In these embodiments, the wells 117A~117D may be electrically isolated from each other. In certain embodiments, the semiconductor structure 100 includes only one, two, or three of the wells 117A~117D.

In some embodiments, the semiconductor structure 100 further comprises a buried layer 102 having the first conductivity type. The buried layer 102 is disposed in the substrate 101 and below wells 111, 113A~113D, and 115A~115D.

The doped region 121 is disposed in the well 111 and has the first conductivity type. In the embodiment illustrated in FIGS. 2A to 2C, the doped concentration of the doped region 121 is higher than the doped concentration of the well 111. The doped regions 122, 123, and 129A are disposed in the well 113A, wherein the doped region 122 has the first conductivity type, and the doped regions 123 and 129A have the second conductivity type. In the embodiment illustrated in FIGS. 2A to 2C, the doped concentration of the doped region 122 is higher than the doped concentration of the well 111, and the doped concentrations of the doped regions 123 and 129A are higher than the doped concentration of the well 113A. In some embodiments, the doped region 122 is adjacent to the doped region 123.

In some embodiments, the doped regions 127, 128, and 129B are disposed in the well 113B, wherein the doped region 127 has the first conductivity type, and the doped regions 128 and 129B have the second conductivity type. Furthermore, the doped region 130A having the first conductivity type is disposed in the well 115A, the doped region 131A having the second conductivity type is disposed in the well 117A, the doped region 130B having the first conductivity type is disposed in the well 115B, and the doped region 131B having the second conductivity type is disposed in the well 117B. In the embodiment illustrated in FIGS. 2A to 2C, the doped concentrations of doped regions 130A, 127, and 130B are higher than doped concentration of the well 111, and the doped concentrations of doped regions 131A, 128, 129B, and 131B are higher than doped concentration of the well 113A. In some embodiments, the doped region 127 is adjacent to the doped region 128. It should be noted that, although the drawings of the present disclosure illustrate the first conductivity type as n-type (e.g. the doped region 121) and illustrate the second conductivity type as p-type (e.g. the doped region 123), this is used for illustration purposes only. In other embodiments, the first conductivity type may be p-type and the second conductivity type may be n-type.

In some embodiments, the semiconductor structure 100 further comprises trench isolations 170, wherein the trench isolations 170 are formed by shallow trench isolation (STI) process. The trench isolations 170 are used to separate different doped regions. For example, the trench isolations 170 separate the doped region 123 from the doped region 129A, separate the doped region 129A from the doped region 130A, separate the doped region 130A from the doped region 131A, separate the doped region 128 from the doped region 129B, separate the doped region 129B from the doped region 130B, and separate the doped region 130B from the doped region 131B. However, any other suitable methods may also be used to separate different doped regions. For example, the conventional local oxidation of silicon (LOCOS) method may be used to form a field oxide to separate the different doped regions.

In some embodiments, the doped regions 129A, 129B, 129C, and 129D collectively constitute a ring structure 129. The ring structure 129 surrounds the doped regions 121, 122, 123, 127, and 128 in X-Y plane. In other embodiments, the doped regions 129A~129D do not constitute a ring structure. In these embodiments, the doped regions 129A~129D may be electrically isolated from each other. In certain embodiments, the semiconductor structure 100 includes only one, two, or three of the doped regions 129A~129D. In some embodiments, the doped regions 130A, 130B, 130C, and 130D collectively constitute a ring structure 130. The ring structure 130 surrounds the ring structure 129 in X-Y plane. In other embodiments, the doped regions 130A~130D do not constitute a ring structure. In these embodiments, the doped regions 130A~130D may be electrically isolated from each other. In certain embodiments, the semiconductor structure 100 includes only one, two, or three of the doped regions 130A~130D. In some embodiments, the doped regions 131A, 131B, 131C, and 131D collectively constitute a ring structure 131. The ring structure 131 surrounds the ring structure 130 in X-Y plane. In other embodiments, the doped regions 131A~131D do not constitute a ring structure. In these embodiments, the doped regions 131A~131D may be electrically isolated from each other. In certain embodiments, the semiconductor structure 100 includes only one, two, or three of the doped regions 131A~131D.

The gate structure 140 is disposed over the substrate 101, and it partially overlaps the wells 111 and 113A. Referring to FIG. 1 and FIGS. 2A to 2C, in some embodiments, the gate structure 140 is disposed on a portion of the surface of the well 111 and a portion of the surface of the well 113A, and disposed between the doped region 121 and the doped region 122. The gate structure 140 comprises a gate dielectric layer 141 and a gate electrode layer 142. In some embodiments, the gate dielectric layer 141 may be formed on the wells 111 and 113A by deposition processes, and the gate electrode layer 142 may be formed on the gate dielectric layer 141 by deposition processes. For example, deposition processes may include physical vapor deposition (PVD) process, chemical vapor deposition (CVD) process, coating process, other suitable processes, and combinations thereof.

The gate dielectric layer 141 may comprise dielectric materials, such as oxide, nitride, oxynitride, oxycarbide, or combinations thereof. The gate dielectric layer 141 may also comprise high-k dielectric materials (e.g. having a dielectric constant greater than 8), such as aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O$), lanthanum oxide ($La_2O_3$), cerium oxide ($CeO_2$), titanium oxide ($TiO_2$), tantalum oxide ($Ta_2O_5$), or combinations thereof, or a like.

In some embodiments, the gate electrode layer 142 may comprise silicon or polysilicon. The gate electrode layer 142 may be doped a doped material for reducing sheet resistance. In other embodiments, the gate electrode layer 142 comprises other materials, such as amorphous silicon, aluminum (Al), copper (Cu), gold (Au), silver (Ag), tungsten (W), titanium (Ti), tantalum (Ta), nickel (Ni), cobalt (Co), ruthenium (Ru), palladium (Pd), platinum (Pt), manganese (Mn), tungsten nitride (WN), titanium nitride (TiN), tantalum nitride (TaN), molybdenum nitride (MoN), tungsten silicide (WSi), titanium silicide ($TiSi_2$), other suitable conductive materials, or combinations thereof. Furthermore, a metal silicide may be selectively formed on the surface of the gate electrode layer 142. In some embodiments, a gap is between the gate structure 140 and the doped region 121. In other words, the gate structure 140 does not contact the doped region 121.

In the embodiment illustrated in FIGS. 2A to 2C, the gate structure 140, the doped regions 121 and 122 constitute a first transistor. The type of the first transistor is not limited in the present disclosure. In a preferred embodiment, the first transistor is a lateral diffused metal oxide semiconductor (LDMOS) transistor. In this embodiment, the gate structure 140 serves as the gate of the first transistor, the doped region 121 serves as the drain of the first transistor, and the doped region 122 serves as the source of the first transistor. In some other embodiments, the doped region 123 is connected with the doped region 122, and the doped regions 122 and 123 collectively serve as the source of the first transistor.

In some embodiments, the semiconductor structure 100 further comprises a gate structure 145. The gate structure 145 is disposed over the substrate 101, and it partially overlaps the wells 111 and 113B. In the embodiment illustrated in FIG. 1 and FIGS. 2A to 2C, the gate structure 145 is disposed on a portion of the surface of the well 111 and a portion of the surface of the well 113B, and is disposed between the doped region 121 and the doped region 127. The gate structure 145 comprises a gate dielectric layer 146 and a gate electrode layer 147. In these embodiments, the gate dielectric layer 146 and the gate electrode layer 147 may be formed by the same or similar processes as that of forming the gate dielectric layer 141 and the gate electrode layer 142. The gate dielectric layer 146 may comprise the same or similar material as the gate dielectric layer 141, and the gate electrode layer 147 may comprise the same or similar material as the gate electrode layer 142.

In the embodiment illustrated in FIG. 1 and FIGS. 2A to 2C, the gate structure 145, the doped regions 121 and 127 constitute a second transistor that is the same as or similar to the first transistor. In this embodiment, the gate structure 145 serves as the gate of the second transistor, the doped region 121 serves as the drain of the second transistor, and the doped region 127 serves as the source of the second transistor. In some other embodiments, the doped region 128 is connected with the doped region 127, and the doped regions 127 and 128 collectively serve as the source of the second transistor. It should be noted that, although FIG. 1 and FIGS. 2A to 2C illustrate only two transistors (the first transistor and the second transistor), the semiconductor structure 100 may include any number of transistors.

The insulating layer 150 is disposed over the substrate 101, and it partially overlaps the gate structure 140. Referring to FIG. 1 and FIGS. 2A to 2C, in some embodiments, the insulating layer 150 overlaps, and is in direct contact with, a portion of the well region III and a portion of the gate electrode layer 142. The material of the insulating layer 150 may include oxide, nitride, oxynitride, low dielectric constant (low-k) material, any other suitable insulating materials, or combinations thereof. The insulating layer 150 may be formed by deposition processes described above. In some embodiments, the thickness of the insulating layer 150 is greater than the thickness of the gate dielectric layer 141.

In some embodiments, the semiconductor structure 100 further comprises an insulating layer 155. The insulating layer 155 is disposed over the substrate 101, and it partially overlaps the gate structure 145. The insulating layer 155 overlaps, and is in direct contact with, a portion of the well region 111 and a portion of the gate electrode layer 147. The insulating layer 155 may have the same or similar material as the insulating layer 150. The insulating layer 155 may be formed by the same process as that of forming the insulating layer 150.

The field plate structure 160 is disposed on the insulating layer 150, and it partially overlaps the gate structure 140. Referring to FIG. 1 and FIGS. 2A to 2C, in some embodiments, the field plate structure 160 is in direct contact with the insulating layer 150, and it partially overlaps the insulating layer 150 and the gate structure 140. The field plate 160 may be used to homogenize the electric field distribution. Furthermore, when the field plate structure 160 overlaps the gate structure 140, a better electric field distribution can be obtained. In some embodiments, the material of the field plate structure 160 is polysilicon. In some other embodiments, the field plate structure 160 has the same or similar material as the gate structure 140.

In some embodiments, the semiconductor structure 100 further comprises a field plate structure 165. The field plate structure 165 is disposed on the insulating layer 155, and it partially overlaps the gate structure 145. The field plate structure 165 is in direct contact with the insulating layer 155, and it partially overlaps the insulating layer 155 and the gate structure 145. In some embodiments, the material of the field plate structure 165 is polysilicon. In some other embodiments, the field plate structure 165 has the same or similar material as the gate structure 140.

In some embodiments, the semiconductor structure 100 further comprises an insulating layer 180. In the embodiment illustrated in FIG. 1 and FIGS. 2A to 2C, the insulating layer 180 covers the wells 111, 113A~113D, 115A~115D, and 117A~117D; the doped regions 121, 122, 123, 127, 128, 129A~129D, 130A~130D, and 131A~131D; the trench isolations 170; the gate structures 140 and 145; the insulating layers 150 and 155; and the field plate structures 160 and 165. In some embodiments, the insulating layer 150 (and the insulating layer 155) and the insulating layer 180 are formed in different steps. For example, the insulating layer 150 and the insulating layer 155 are formed first, then the field plate structures 160 and 165 are formed on the insulating layers 150 and 155, and then the insulating layer 180 is formed.

In some embodiments, the semiconductor structure 100 further comprises a circuit layer 190. The circuit layer 190 comprises a plurality of electrodes and a plurality of interconnect lines. The electrodes are connected to each other by interconnect lines. The electrodes are eclectically connected to some features of the semiconductor structure by through holes within the insulating layer 180. In some embodiments, the electrodes 221A and 221B are electrically connected to the doped region 121 through the through holes 201A and 201B, respectively, and serve as drain contact terminals. The electrodes 222A and 222B are electrically connected to the field plate structure 160 through the through holes 202A and 202B, respectively, and serve as field plate contact terminals. The electrodes 223A and 223B are electrically connected to the gate electrode layer 142 through the through holes 203A and 203B, respectively, and serve as gate contact terminals. The electrodes 224A and 224B are electrically connected to the doped region 122 through the through holes 204A and 204B, respectively, and serve as source contact terminals. In other embodiments, the electrodes 225A and 225B are electrically connected to the doped region 123 through the through holes 205A and 205B, respectively, and serve as source contact terminals together with the electrodes 224A and 224B. The electrodes 226A and 226B are electrically connected to the doped region 129A through the through holes 206A and 206B, respectively.

In some embodiments, the electrodes 227A and 227B are electrically connected to the field plate structure 165 through the through holes 207A and 207B, respectively, and serve as field plate contact terminals. The electrodes 228A and 228B are electrically connected to the gate electrode layer 147 through the through holes 208A and 208B, respectively, and serve as gate contact terminals. The electrodes 229A and 229B are electrically connected to the doped region 127 through the through holes 209A and 209B, respectively, and serve as source contact terminals. In other embodiments, the electrodes 230A and 230B are electrically connected to the doped region 128 through the through holes 210A and 210B, respectively, and serve as source contact terminals together with the electrodes 229A and 229B. The electrodes 231A and 231B are electrically connected to the doped region 129B through the through holes 211A and 211B, respectively.

The present disclosure improves the performance of semiconductor devices (e.g. the first transistor and/or second transistor described above) by introducing the field plate structure. In general, when the field plate is tied (or electrically connected) to the gate, the on-resistance (Ron) of the semiconductor structure can be reduced and the current can be increased, but the total gate charge (Qg) of the semiconductor structure will be increased and thus the switching speed will be reduced. On the other hand, when the field plate is electrically connected to the source, the on-resistance will be increased and the total gate charge can be reduced. In view of this, the present disclosure provides a structure and method, by segmenting the field plate structure into a plurality of partial field plates and electrically connecting the plurality of partial field plates to the gate or the source, respectively, to obtain better on-resistance and total gate charge. At the same time, by electrically connecting partial field plates with different lengths to the gate and/or source, different on-resistances and/or total gate charges can be obtained. According to the present disclosure, the on-resistance and total gate charge can be flexibly configured by segmenting the field plate structure (e.g. segmenting into different numbers of partial field plate and/or different lengths) based on design requirements to obtain the desired device performance. In addition, it is also possible to flexibly configure the on-resistance and total gate charge to obtain the best figure of merit (FOM, defined as Ron*Qg), wherein the smaller FOM is better.

In some embodiments, as shown in FIGS. 1 and 2C, the field plate structure 160 is segmented into partial field plates 161, 162, and 163 along Y direction, wherein the partial field plates 161, 162, and 163 are separated from each other. The partial field plates 161, 162, and 163 have lengths L1, L2, and L3, respectively. In the embodiment illustrated in FIGS. 1 and 2C, the lengths L1 and L3 are greater than the length L2. In some embodiments, the field plate structure 165 is segmented into partial field plates 166, 167, and 168 along Y direction, wherein the partial field plates 166, 167, and 168 are separated from each other. The partial field plates 166, 167, and 168 have the same or similar configuration and length as the partial field plates 161, 162, and 163.

In one embodiment, the partial field plates 161, 163 and/or 166, 168 having longer lengths are electrically connected to the source to obtain less total gate charge. The partial field plates 162 and/or 167 having shorter lengths are electrically connected to the gate to obtain a smaller on-resistance. In this embodiment, the figure of merit (FOM) is about 290~300 ($\Omega \times pC$), where $\Omega$ is ohm and pC is picocoulomb. The present disclosure does not limit how the longer partial field plates (e.g. partial field plates 161, 163, 166, and 168) are electrically connected to the source. In one possible embodiment (as shown in FIG. 2A), the partial field plate 161 of the field plate structure 160 can be electrically connected to the electrode 224A via the through hole 202A, the electrode 222A, and the interconnect line 241, wherein the electrode 224A serves as the source contact terminal. The partial field plate 166 of the field plate structure 165 can be electrically connected to the electrode 229A via the through hole 207A, the electrode 227A, and the interconnect line 242, wherein the electrode 229A serves as the source contact terminal. Similarly, the present disclosure also does not limit how the shorter partial field plates (e.g. partial field plates 162 and 167) are electrically connected to the gate. In one possible embodiment (as shown in FIG. 2B), the partial field plate 162 of the field plate structure 160 can be electrically connected to the electrode 223B via the through hole 202B, the electrode 222B, and the interconnect line 243, wherein the electrode 223B serve as the gate contact terminal. The partial field plate 167 of the field plate structure 165 can be electrically connected to the electrode 228B via the through hole 207B, the electrode 227B, and the interconnect line 245, wherein the electrode 228B serve as the gate contact terminal. In some embodiments, the electrodes 224B, 225B, and 226B are connected to each other by the interconnect line 244, and the electrodes 229B, 230B, and 231B are connected to each other by the interconnect line 246. In one embodiment, the length L1 and the length L3 are in a range between about 90 micrometers (um) to 120 um, and the length L2 is in a range between about 10 um to 30 um, however, the lengths are not limited thereto, those skilled in the art can adjust the lengths according to actual requirements. In a comparative embodiment, the longer partial field plates 161, 163 and/or 166, 168 are electrically connected to the gate to obtain a smaller on-resistance, and the shorter partial field plates 162 and/or 167 are electrically connected to the source to obtain less total gate charge. In this embodiment, the figure of merit (FOM) is about 300~310 (Ω×pC). The main difference between the embodiment and the comparative embodiment and between the FOM is that the electrical connection mode is different, while the component composition and dimensions of both of the embodiment and the comparative embodiment are substantially the same.

Figure 3:
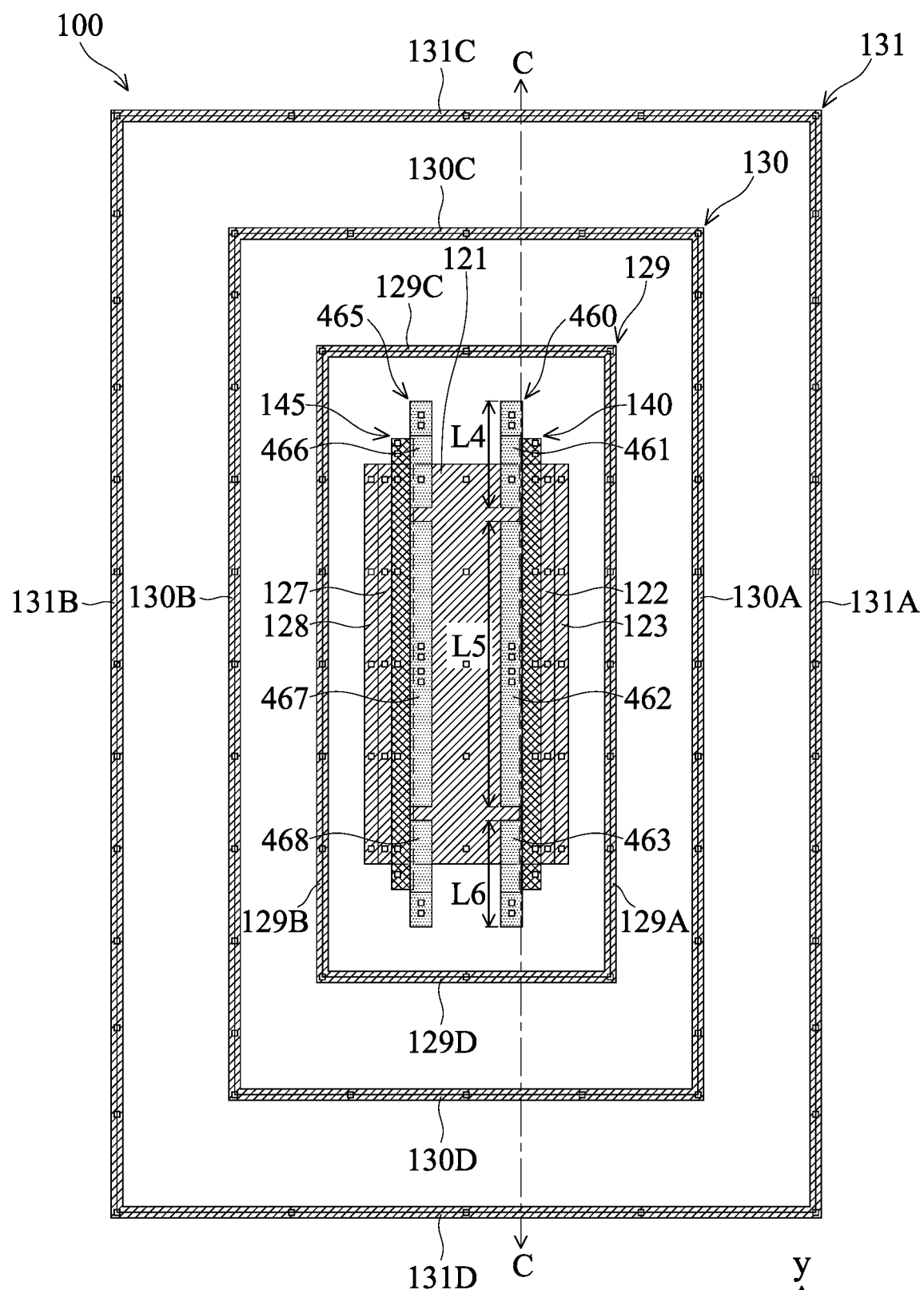
FIG. 3 is a top view of another exemplary embodiment of a semiconductor structure, according to various aspects of the present disclosure.
Figure 4:
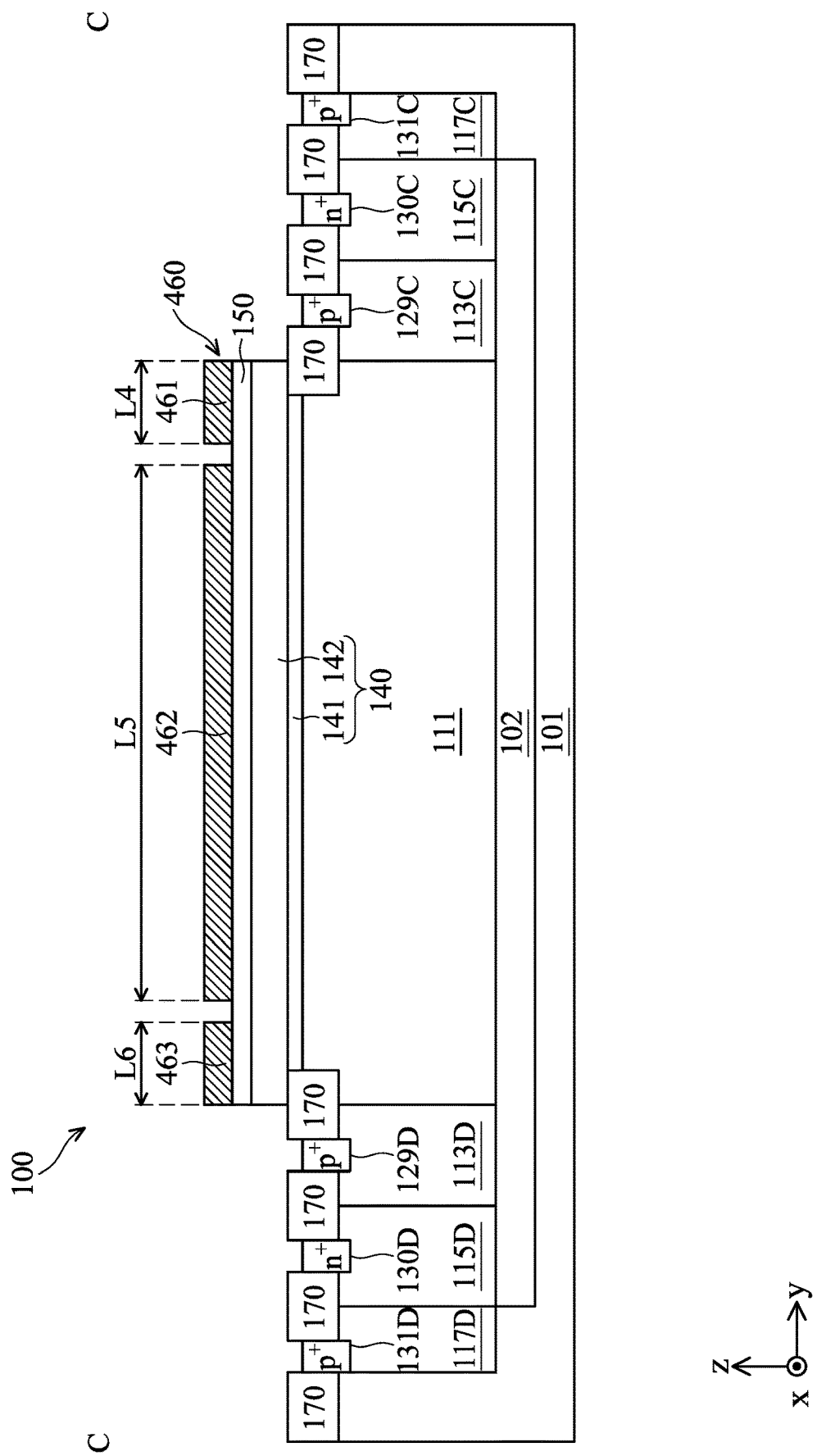
FIG. 4 is a cross-sectional view of the semiconductor structure along a line C-C in FIG. 3, according to various aspects of the present disclosure.

FIG. 3 is a top view of a semiconductor structure of the present disclosure. FIG. 4 is a cross-sectional view of the semiconductor structure of the present disclosure along the line C-C in FIG. 3. It should be noted that, for the purpose of simplicity and clarity, some features and/or reference signs are omitted in FIG. 3 and FIG. 4. In addition, some features in FIG. 3 and FIG. 4 are the same as or similar to those in FIG. 1 and FIGS. 2A to 2C, so the same reference signs are used for labeling these features herein.

In some embodiments, as shown in FIGS. 3 and 4, the field plate structure 460 is segmented into partial field plates 461, 462, and 463 along Y direction, wherein the partial field plates 461, 462, and 463 are separated from each other. The partial field plates 461, 462, and 463 have lengths L4, L5, and L6, respectively. In the embodiment illustrated in FIGS. 3 and 4, the length L5 is greater than the lengths L4 and L6. In some embodiments, the field plate structure 465 is segmented into partial field plates 466, 467, and 468 along Y direction, wherein the partial field plates 466, 467, and 468 are separated from each other. The partial field plates 466, 467, and 468 have the same or similar configuration and length as the partial field plates 461, 462, and 463.

In one embodiment, the partial field plates 461, 463 and/or 466, 468 having shorter lengths are electrically connected to the source to obtain less total gate charge. The partial field plates 462 and/or 467 having longer lengths are electrically connected to the gate to obtain a smaller on-resistance. For example, similar to FIG. 2A, the shorter partial field plates 461, 463 and/or 466, 468 can be electrically connected to the electrode serving as the source contact terminal via the through hole, the electrode, and the interconnect line. On the other hand, similar to FIG. 2B, the longer partial field plates 462 and/or 467 can be electrically connected to the electrode serving as the gate contact terminal via the through hole, the electrode, and the interconnect line.

In a comparative embodiment, the shorter partial field plates 461, 463 and/or 466, 468 are electrically connected to the gate to obtain a smaller on-resistance; and the longer partial field plates 462 and/or 467 are electrically connected to the source to obtain less total gate charge. The main difference between the embodiment and the comparative embodiment is that the electrical connection mode is different, while the component composition and dimensions of both of the embodiment and the comparative embodiment are substantially the same.

Figure 5:
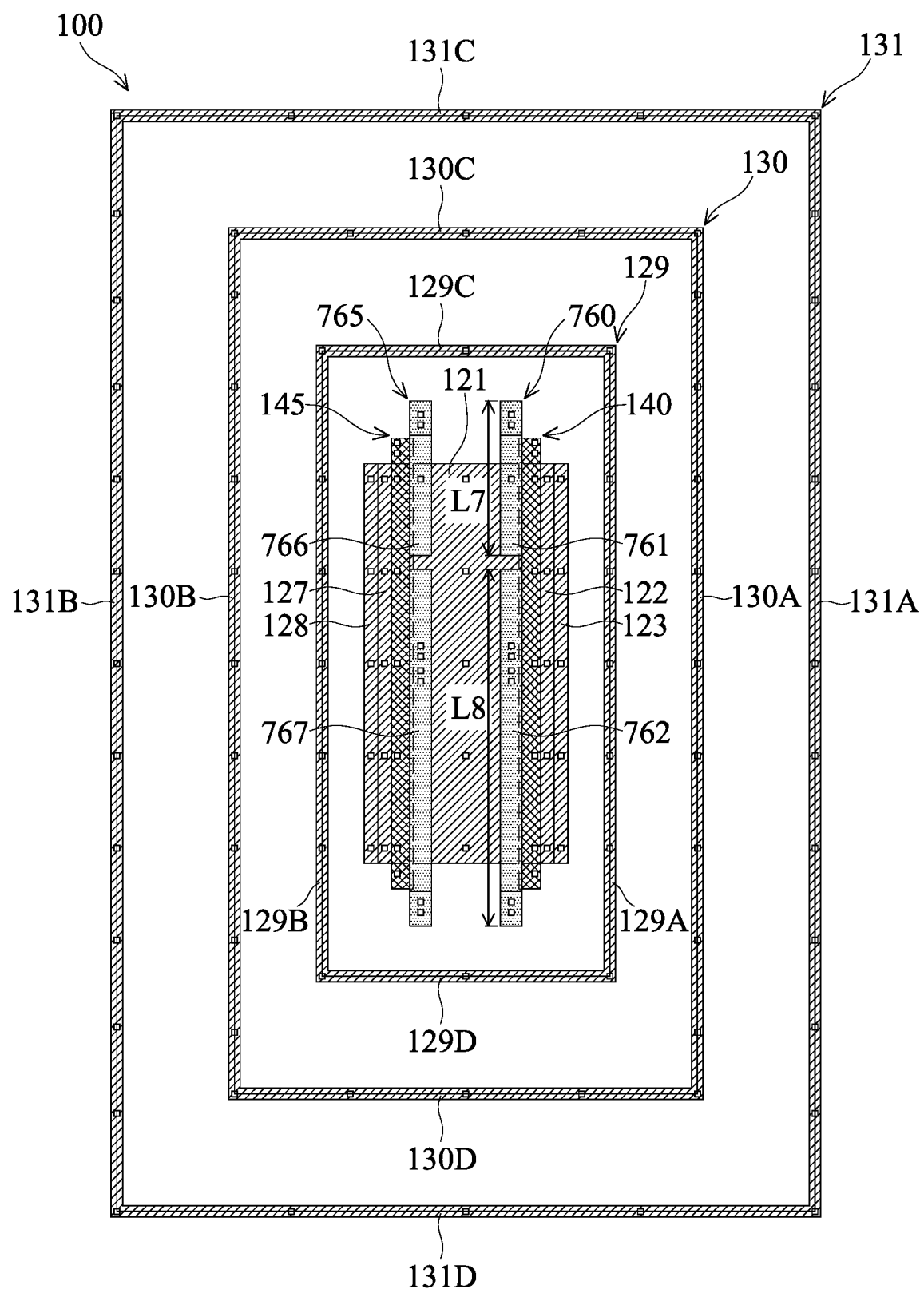
FIG. 5 is a top view of yet another exemplary embodiment of a semiconductor structure, according to various aspects of the present disclosure.

FIG. 5 is a top view of a semiconductor structure of the present disclosure. It should be noted that, for the purpose of simplicity and clarity, some features and/or reference signs are omitted in FIG. 5. In addition, some features in FIG. 5 are the same as or similar to those in FIG. 1 and FIGS. 2A to 2C, so the same reference signs are used for labeling these features herein.

In some embodiments, as shown in FIG. 5, the field plate structure 760 is segmented into partial field plates 761 and 762 along Y direction, wherein the partial field plates 761 and 762 are separated from each other. The partial field plates 761 and 762 have lengths L7 and L8, respectively. In the embodiment illustrated in FIG. 5, the length L7 is less than the length L8. However, in other embodiments, the length L7 may greater than or equal to the length L8. In some embodiments, the field plate structure 765 is segmented into partial field plates 766 and 767 along Y direction, wherein the partial field plates 766 and 767 are separated from each other. The partial field plates 766 and 767 have the same or similar configuration and length as the partial field plates 761 and 762.

In one embodiment, the partial field plates 761 and/or 766 are electrically connected to the source to obtain less total gate charge. The partial field plates 762 and/or 767 are electrically connected to the gate to obtain a smaller on-resistance. For example, similar to FIG. 2A, the partial field plates 761 and/or 766 can be electrically connected to the electrode serving as the source contact terminal via the through hole, the electrode, and the interconnect line. On the other hand, similar to FIG. 2B, the partial field plates 762 and/or 767 can be electrically connected to the electrode serving as the gate contact terminal via the through hole, the electrode, and the interconnect line.

In a comparative embodiment, the partial field plates 761 and/or 766 are electrically connected to the gate to obtain a smaller on-resistance; and the partial field plates 762 and/or 767 are electrically connected to the source to obtain less total gate charge. The main difference between the embodiment and the comparative embodiment is that the electrical connection mode is different, while the component composition and dimensions of both of the embodiment and the comparative embodiment are substantially the same.

Although the drawings of the present disclosure only illustrate the embodiments of segmenting the field plate structure into two or three partial field plates, it should be understood that, the present disclosure also encompasses the embodiments of segmenting the field plate structure into four or more partial field plates. In these embodiments, each of the partial field plates can be individually electrically connected to the source or gate to obtain the desired total gate charge and on-resistance.

Although in the drawings of the present disclosure, the semiconductor structure 100 is illustrated to have two transistors, the semiconductor structure 100 may have any number of transistors. For example, the semiconductor structure 100 may comprise one, three or more transistors. In addition, in the semiconductor structure 100, different field plate structures may have different configurations. For example, different field plate structures may be segmented to have different numbers of partial field plates, and/or partial field plates of different field plate structures may be segmented to have different lengths to obtain desired device performance.

According to the present disclosure, the field plate can be segmented into a plurality of partial field plates, and the plurality of partial field plates may be respectively electrically connected to gate or source to obtain better on-resistance and total gate charge. At the same time, the segmented partial field plates can be configured to have different lengths to obtain different combinations of on-resistance and total gate charge. As a result, the on-resistance and total gate charge can be flexibly configured by segmenting the field plate based on design requirements to obtain the desired device performance. In addition, the best figure of merit (FOM) can also be obtained by flexibly configuring the on-resistance and the total gate charge.

Unless otherwise defined, all terms (including technical and scientific terms) used herein have the same meaning as commonly understood by one of ordinary skill in the art to which this disclosure belongs. It should be further understood that terms such as those defined in commonly used dictionaries should be interpreted as having a meaning that is consistent with their meaning in the context of the relevant art and will not be interpreted in an idealized or overly formal sense unless expressly so defined herein.

While the present disclosure has been described by way of example and in terms of the preferred embodiments, it should be understood that the present disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor structure, comprising:
   a substrate;
   a first well, disposed in the substrate and having a first conductivity type;
   a second well, disposed in the substrate, adjacent to the first well, and having a second conductivity type that is opposite to the first conductivity type;
   a first doped region, disposed in the first well;
   a second doped region, disposed in the second well;
   a first gate structure and a second gate structure, the first gate structure is disposed between the first doped region and the second doped region;
   a first insulating layer, overlapping a portion of the first well and a portion of the first gate structure; and
   a first field plate structure, disposed on the first insulating layer and at least partially overlapping the first gate structure, wherein the first field plate structure is segmented into a first partial field plate having a first length, a second partial field plate having a second length, and a third partial field plate having a third length along a first direction, wherein the first gate structure and the second gate structure are arranged along a second direction perpendicular to the first direction, wherein the first partial field plate, the second partial field plate and the third partial field plate are separated from each other, and wherein the first length and the third length are greater than the second length.

2. The semiconductor structure as claimed in claim 1, wherein the first partial field plate and the third partial field plate are electrically connected to the second doped region, and the second partial field plate is electrically connected to the first gate structure, wherein the second doped region is a source.

3. The semiconductor structure as claimed in claim 2, wherein the first partial field plate, the second partial field plate, and the third partial field plate are connected to the second doped region or the first gate structure by through holes and interconnect lines.

4. The semiconductor structure as claimed in claim 1, wherein the first partial field plate and the third partial field plate are electrically connected to the first gate structure, and the second partial field plate is electrically connected to the second doped region, wherein the second doped region is a source.

5. The semiconductor structure as claimed in claim 1, wherein the first field plate structure is segmented into a plurality of partial field plates including the first partial field plate, the second partial field plate, and the third partial field plate along the first direction, wherein each of the plurality of partial field plates is individually electrically connected to the first gate structure or the second doped region.

6. The semiconductor structure as claimed in claim 1, further comprising a third doped region disposed in the second well, wherein the third doped region is adjacent to the second doped region and connects to the second doped region, and wherein the second doped region has the first conductivity type and the third doped region has the second conductivity type.

7. The semiconductor structure as claimed in claim 1, further comprising a third well, disposed in the substrate, adjacent to the first well, and having the second conductivity type.

8. The semiconductor structure as claimed in claim 7, further comprising:
   a fourth doped region, disposed in the third well;
   a second gate structure, disposed between the first doped region and the fourth doped region;
   the second insulating layer, overlapping a portion of the first well and a portion of the second gate structure; and
   a second field plate structure, disposed on the second insulating layer and partially overlapping the second gate structure, wherein the second field plate structure is segmented into a fourth partial field plate and a fifth partial field plate along the first direction, and wherein the fourth partial field plate and the fifth partial field plate are separated from each other.

9. The semiconductor structure as claimed in claim 8, wherein the second field plate structure is segmented into a plurality of partial field plates including the fourth partial field plate and the fifth partial field plate along the first direction, wherein each of the plurality of partial field plates is individually electrically connected to the second gate structure or the fourth doped region.

10. The semiconductor structure as claimed in claim 7, further comprising a fourth well, disposed in the substrate, surrounding the third well, and having the second conductivity type.

11. The semiconductor structure as claimed in claim 1, further comprising a buried layer, disposed below the first well and the second well, and having the first conductivity type.

12. The semiconductor structure as claimed in claim 1, wherein the second well constitutes a first ring structure.

13. The semiconductor structure as claimed in claim 7, wherein the third well constitutes a second ring structure.

14. A semiconductor structure, comprising:
    a substrate;
    a first well, disposed in the substrate and having a first conductivity type;
    a second well, disposed in the substrate, adjacent to the first well, and having a second conductivity type that is opposite to the first conductivity type;
    a first doped region, disposed in the first well;
    a second doped region, disposed in the second well;
    a first gate structure and a second gate structure, the first gate structure is disposed between the first doped region and the second doped region;
    a first insulating layer, overlapping a portion of the first well and a portion of the first gate structure; and
    a first field plate structure, disposed on the first insulating layer and at least partially overlapping the first gate structure, wherein the first field plate structure is segmented into a first partial field plate having a first length, a second partial field plate having a second length, and a third partial field plate having a third length along a first direction, wherein the first gate structure and the second gate structure are arranged along a second direction perpendicular to the first direction, wherein the first partial field plate, the second partial field plate, and the third partial field plate are separated from each other, and wherein the second length is greater than the first length and the third length.

15. The semiconductor structure as claimed in claim 14, wherein the first partial field plate and the third partial field plate are electrically connected to the second doped region, and the second partial field plate is electrically connected to the first gate structure.

16. The semiconductor structure as claimed in claim 14, wherein the first partial field plate and the third partial field plate are electrically connected to the first gate structure, and the second partial field plate is electrically connected to the second doped region.

* * * * *